United States Patent [19]

Dotsko

[11] Patent Number: 4,794,321

[45] Date of Patent: Dec. 27, 1988

[54] VARIABLE CAPACITY PROXIMITY SENSOR

[75] Inventor: Martin Dotsko, Binghamton, N.Y.

[73] Assignee: Dotsko Enterprises, Inc., Binghamton, N.Y.

[21] Appl. No.: 126,013

[22] Filed: Nov. 27, 1987

[51] Int. Cl.[4] ............................................. G01R 27/26
[52] U.S. Cl. ................................. 324/61 P; 324/61 R
[58] Field of Search .......................... 324/61 R, 61 P; 361/179, 181; 340/870.37; 434/38

[56] References Cited

U.S. PATENT DOCUMENTS 4,330,284 5/1982 Dotsko et al. ..................... 324/61 P Primary Examiner—Reinhard J. Eisenzopf
Assistant Examiner—Anthony L. Miele
Attorney, Agent, or Firm—Richard G. Stephens

[57] ABSTRACT

A plurality of electrically conductive plates, preferably ring-shaped, are spaced from one another and electrically insulated from a conventional conductive probe rod, but movable therewith. The sizes and spacing of the plates are selected to provide a desired variation in capacitance between the plates and the object as the probe rod and the plates are moved toward the object. The capacitance between the probe rod and the object also increases as the probe rod moves toward the object. By appropriately combining these two capacitances, a nearly consant net capacitance occurs when the probe tip is very near a desired distance from the object, for a range of object sizes.

20 Claims, 2 Drawing Sheets

VARIABLE CAPACITY PROXIMITY SENSOR

BACKGROUND OF THE INVENTION

My invention relates to apparatus for sensing the presence or precise position of an object and, more particularly, to apparatus that performs such object sensing by measurement of capacitance.

In certain fields of engineering and industry, such as automation and robotics, it is important to detect presence and position of objects accurately for subsequent handling thereof. For example, detecting the location of a screw head may be necessary in order for a screw insertion device on an assembly line to engage the screw properly and efficiently and to fasten two or more parts to one another. Similarly, the placement of electrical components on a printed circuit board can be facilitated by accurately determining their initial position prior to their selection.

Often, due to the nature of the object being measured or the equipment subsequently used, a sensing tool that makes physical contact with the object is inappropriate. For example, relatively fragile objects should not be unduly manipulated or subjected to force. Likewise, the geometry of certain assembly apparatus or scientific instruments may not land themselves to contact measurement of objects. Finally, objects in motion would generally not be good candidates for contact measurement, as such contact would tend to impede such motion.

Non-contact measuring devices such as optical, electromagnetic, infrared, eddy current and electrostatic capacitance sensors, sometimes under control of computer programs, have been used with varying degrees of success. U.S. Pat. No. 4,686,531 issued to Shambroom et al discloses a capacitance height gage having four measuring and two reference capacitor circuits. Four measuring plates are disposed opposite the object surface to be measured and the object surface itself forms the ground plate. Reference capacitors provide voltage regulation to ensure that a stable signal drives the measuring capacitors.

U.S. Pat. No. 4,451,780 issued to Ogasawara discloses a non-contact capacitance microdisplacement meter having two different sized electrodees disposed opposite the object to be measured. Two electrostatic capacitances are thus generated and coupled to separate oscillator circuits to result in a displacement signal indicative of displacement of the object.

One common limitation of prior capacitative sensors is their susceptibility to error when they encounter objects of varying size. For many applications it is desirable that a capacitive sensor provide a signal when a probe tip being moved toward an object reaches a desired distance from the object, irrespective of the size thereof. To pose a simplified example, it might be desired to provide a signal when a movable probe tip reaches a distance of 0.05 inch from a coin. Prior capacitive sensors will readily provide such a signal when a probe tip is 0.05 inch from a given size coin, such as a dime; but such prior sensors tend to provide the same signal when the probe tip is a greater distance, say 0.10 inch, from a larger coin, such as a quarter. If the prior sensors are adjusted to provide the appropriate signal when the probe tip is the desired 0.05 inch from the quarter, they do not provide the signal until the probe tip is nearer than desired, say 0.02 inch, from the dime.

The aforementioned problem encountered by prior art devices makes it impossible to preset the position sensor with respect to the objects being detected unless all such objects are of identical size. In certain environments, that is simply not the case.

It might be desired that the signal be produced when a probe tip became 1.00 inch (rather than 0.05 inch) from a coin of any size, or at various other distances. Prior art measuring devices are not normally amenable to such adjustments or, when they are, not without necessitating significant effort and setup time on the part of the technician.

Thus a primary object of the present invention is to provide a capacitive sensor which will provide a signal when a probe tip reaches a desired distance from an object, irrespective, within limits, of the size or shape of the object.

Another object of the present invention is to make readily adjustable the distance at which the signal occurs, for an object of any shape and size, over a range of sizes.

Still another object of the invention is to provide apparatus for determining position of an object in a single sensing operation whether it is metallic or nonmetallic.

Yet another object of the invention is to facilitate presetting of the distance between object and sensor prior to operation thereof so that a substantially constant distance between object and sensor can be maintained notwithstanding variations in object size.

Other objects of the invention will in part be obvious and will in part appear hereinafter.

SUMMARY OF THE INVENTION

In accordance with one central concept of the present invention, a plurality of electrically conductive plates, preferably ring-shaped, are spaced from one another and electrically insulated from a conventional conductive probe rod, but movable therewith. The sizes and spacing of the plates are selected to provide a desired variation in capacitance between the plates and the object as the probe rod and the plates are moved toward the object. The capacitance between the probe rod and the object also increases as the probe rod moves toward the object. By appropriately combining these two capacitances, a nearly constant net capacitance occurs when the probe tip is very near a desired distance from the object, for a range of object sizes.

The invention accordingly comprises the features of construction, combination of elements, and arrangement of parts, which will be exemplified in the construction hereinafter set forth, and the scope of the invention will be indicated in the claims.

BRIEF DESCRIPTION OF THE DRAWINGS

For a fuller understanding of the nature and objects of the invention reference should be had to the following detailed description taken in connection with the accompanying drawings, in which.

DETAILED DESCRIPTION OF THE PREFERRED EMBODIMENT

Figure 1:
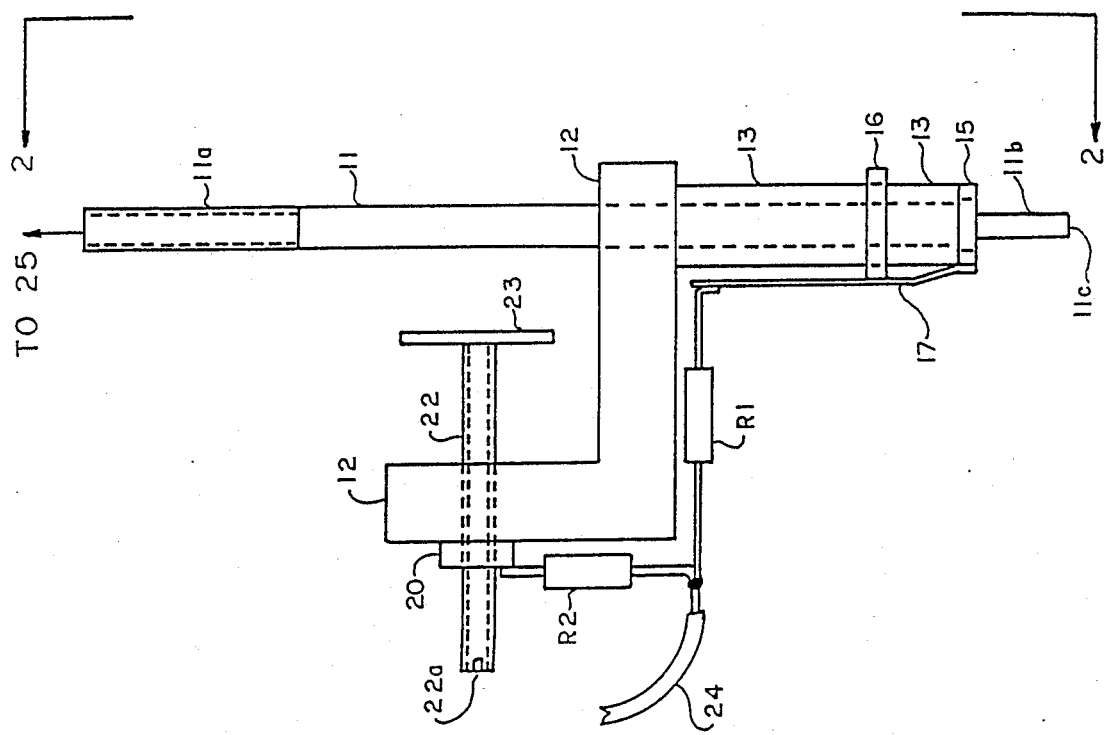
FIG. 1 is a side elevation view of one form of sensor constructed in accordance with the invention.
Figure 2:
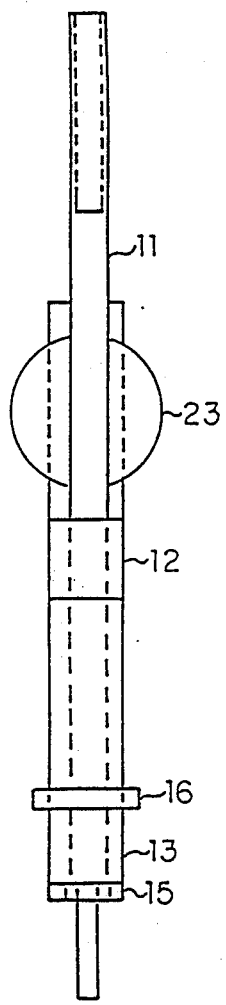
FIG. 2 is an end elevation view taken at lines 2—2 in FIG. 1.

Referring to FIGS. 1 and 2, a preferred embodiment of sensor is shown as comprising a generally cylindrical electrically conductive probe rod 11 having a threaded portion 11a at its upper end and a reduced diameter lower end tip 1b culminating in a furthermost extremity 11c. The probe rod 11 is fixedly attached to an insulating support bracket 12 by a press-fit in a hole through bracket 12. Insulating sleeve 13 carried on rod 11 supports a first or lower conductive biasing ring 15 attached by cement or by other suitable means to the end of insulating sleeve 13, and a second or upper conductive biasing ring 16 which is press-fitted onto sleeve 13. Rings 15 and 16 encircle probe rod 11, but have inner diameters greater than the outer diameter or rod 11, so that they do not touch rod 11. It should be understood that any shape rod 11 and elements 15, 16 can be used in alternate embodiments and that complete encircling of a rod by elements may not be required.

The size and location of each of the aforementioned components can be calculated in accordance with the disclosure of U.S. Pat. No. 4,330,284, issued to Dotsko et al and incorporated by reference herein. Capacitance C is calculated as follows:

$$C = 0.225 \text{ K} \frac{(N-1)}{t} A$$

where:
C = capacitance in picofarads
K = dielectric constant between plates (= 1.0 for air)
A = area of one plate in square inches
N = number of plates
t = thickness of dielectric in inches In one successful embodiment of the invention, the main diameter of probe rod 11 is 0.125 inch (0.318 cm), and the diameter of its tip 11b is 0.052 inch (0.132 cm). Lower ring 15 has an outside diameter of 0.250 inch (0.635 cm), and inside diameter of 0.187 inch (0.475 cm) and is 0.032 inch (0.081 cm) thick. Upper ring 16 has an outside diameter of 0.345 inch (0.876 cm), an inside diameter of 0.250 inch (0.635 cm), and is also 0.032 inch (0.081 cm) thick. The lower surface of lower ring 15 is located 0.300 inch (0.762 cm) upwardly from the extremity 11c of tip 11b, and the lower surface of upper ring 16 is located 0.600 inch (1.524 cm) from the extremity 11c of tip 11b. In other embodiments of the present invention, biasing rings with progressively greater outside diameters can be placed at increasingly greater distances from the extremity 11c of probe rod tip 11b.

A stiff piece of electrically conductive wire 17 soldered or otherwise suitably electrically connected to rings 15, 16 is also connected to resistor R1. A second resistor R2 is connected between resistor R1 and a metal plate 20 affixed to support bracket 12. An electrically conductive adjustment rod 22 threaded through plate 20 and bracket 12 extends toward probe rod 11 and carries an electrically conductive metallic plate or circular disc 23 at one end. Disc 23 is oriented so that its major axis is substantially parallel to the axis of probe rod 11. In the specific embodiment, disc 23 has a diameter of 0.500 inch (1.270 cm). The other end of adjustment rod 22 is slotted, at 22a, to accommodate a screwdriver, not shown, for adjustment of disc 23 toward and away from probe rod 11. Other mechanisms for turning rod 22 manually or automatically can, of course, be used to replace the slot 22a, as is well known in the art. A flexible wire 24 attaches the junction point between resistors R1 and R2 to a capacitance measuring circuit as hereinbelow further described. In the specific embodiment being described, resistors R1 and R2 each have a value of 10 megohms.

Figure 3:
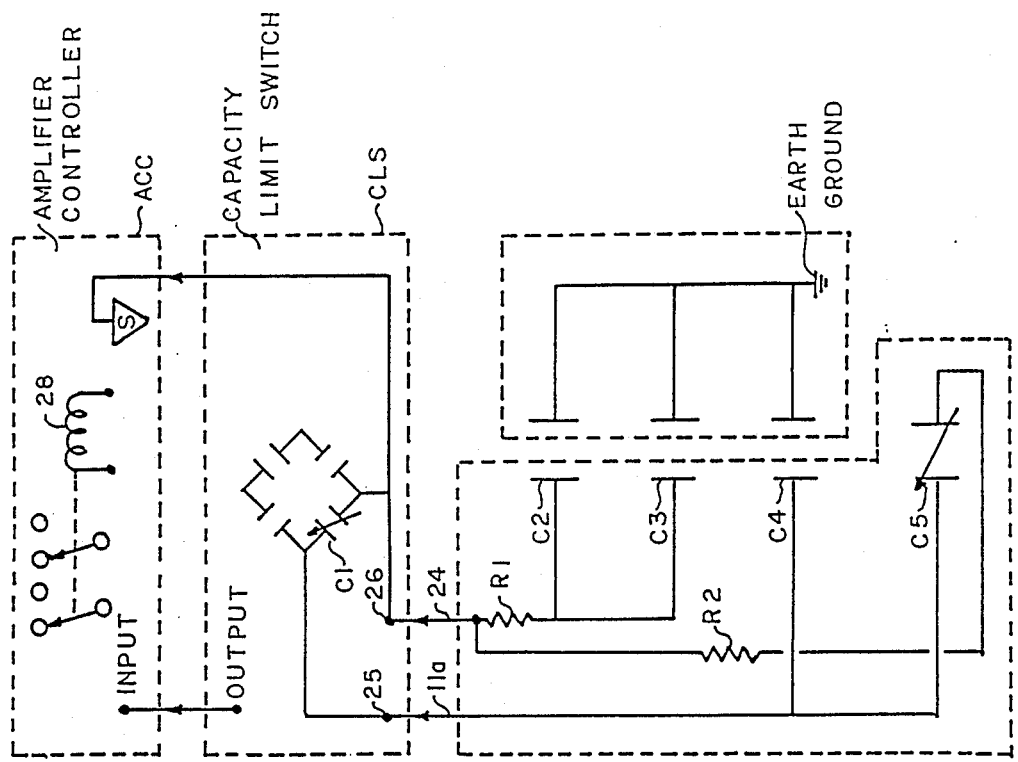
FIG. 3 is an electric schematic diagram showing the sensor of FIGS. 1 and 2 connected to a known form of capacitance measuring equipment.

As shown in FIG. 3, the threaded end 11a of probe rod 11 is connected to the signal input terminal 25 of a capacitance measuring circuit CLS, and wire 24 is connected to the signal ground terminal 26 of circuit CLS. Circuit CLS may comprise, for example, a Series 7053 capacity limit switch available from Automatic Timing & Controls Co., King of Prussia, Pa.

Circuit CLS compares the net capacitance presented at its terminals 25, 26 with an internal adjustable capacitance represented as capacitor C1 and provides a signal to amplifier controller circuit ACC upon occurrence of a predetermined relationship between those capacitances. Upon receipt of that signal, circuit ACC operates a relay 28.

The net capacitance which circuit CLS detects and uses to determine when the signal will be sent, comprises the capacitance detected by signal input terminal 25, minus the capacitance detected by signal ground terminal 26.

Capacitor C2 represents the capacitance between lower biasing ring 15 (FIG. 1) and the object, not shown. Capacitor C3 represents the capacitance between upper biasing ring 16 (FIG. 1) and the object. Capacitor C4 represents the capacitance between the extremity 11c of probe rod 11 and the object. Capacitor C5 represents the capacitance between adjustable disc 23 (FIG. 1) and probe rod 11.

With disc 23 spaced a given distance from rod 11, if the position sensing assembly of FIG. 1 is moved downwardly toward an object, it will be apparent that capacitances C2, C3 and C4 will simultaneously increase, though at different rates. Theoretically, other capacitances exist, and they also would increase. For example, capacitances theoretically exist between the resistor leads and the object and between adjustment rod 22 and the object. However, because the resistor leads and rod 22 are much further away from the object, their capacitances with respect to the object are negligibly small compared to those associated with the extremity 11c of probe tip 11b and the biasing rings 15, 16. Such second order capacitances can therefore be ignored.

Figure 4:
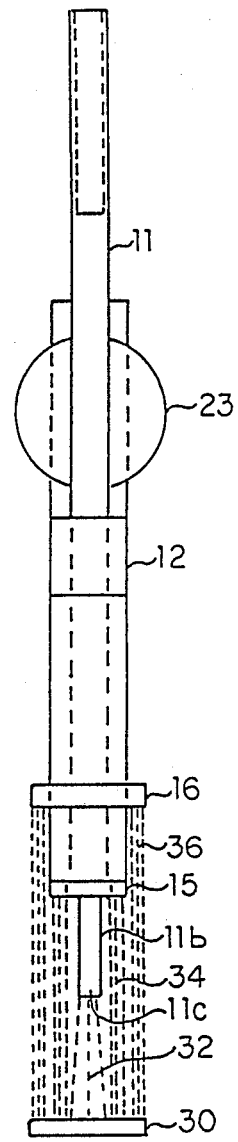
FIG. 4 is an end elevation view of the sensor, object and dielectric flux field in accordance with the present invention.

Referrring now to FIG. 4, dielectric flux fields are shown terminating at an object 30, the position of which is to be determined by the apparatus of the present invention. The dielectric flux field between the object 30 and probe tip 11b is shown at reference numeral 32. The dielectric flux field between the object 30 and lower biasing ring 15 is shown at reference numeral 34. And the dielectric flux field between the object 30 and upper biasing ring 16 is shown at reference numeral 36.

When the object 30 is of the same diameter as the probe tip 11c, the object 30 is as great as the projection on it of the dielectric flux field 32. If the distance between the object and probe tip 11b has been present as hereinbelow described, relay 28 (FIG. 3) is actuated when the preset value is reached. If the object size increases, as shown in FIG. 4, so as to include flux fields 34 and 36, the capacitance between the object 30 and the sensor also increases and the distance therebetween would normally increase. However, the capacitance between the object 30 and biasing rings 15, 16 is referenced through resistor R1 to the signal ground of the amplifier controller circuit ACC. In this manner the capacitance between the object 30 and biasing rings 15, 16 is substracted from the capacitance between the probe tip 11b and the object 30, and the distance therebetween will remain constant even though the object size increases.

The reference level at which relay 28 actuates, as determined by the capacity bridge network and its associated electronic circuitry (FIG. 3), is calculated as follows:

$$\text{Relay}_{(actuation\ level)} = (C4+C5)-(C2+C3)+C1$$

The biasing effect of biasing rings 15, 16 ensures that the distance between object 30 and probe tip 11b remains nearly constant at the preset value regardless of object size.

To calibrate the system, adjustment rod 22 is first adjusted to move disc 23 to its extreme position away from probe rod 11. The metallic object 30 is placed a predetermined distance from the extremity 11c of probe rod tip 11b. In the aforementioned embodiment, the distance is between 0.01 and 0.02 inch (0.25 to (0.50 mm). Capacitor C1 is then adjusted to actuate relay 28.

The object 30 is now positioned 0.20 inch (5.0 mm) from the extremity 11c of probe rod tip 11b. Adjustment rod 22 is now adjusted to move disc 23 towards probe rod 11 until relay 28 is again actuated.

The foregoing procedure presets relay 28 to actuate when an object 30 is 0.20 inch (5.0 mm) from the extremity 11c of probe rod tip 11b in this embodiment. An identical calibrating and presetting procedure can be used for non-metallic objects as well.

Figure 5:
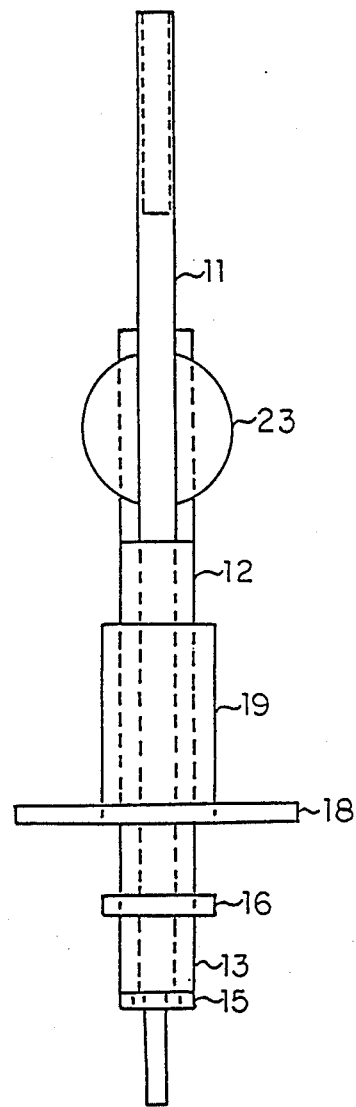
FIG. 5 is an end elevation view generally similar to FIG. 2 showing an embodiment having a third biasing ring.

A modified embodiment shown in FIG. 5 is generally similar to the embodiment shown in FIGS. 1 and 2, but provided with an additional conductive biasing ring 18 shown mounted rearwardly from rings 15 and 16. An insulator 19 press-fitted on insulating sleeve 13 supports ring 15. Wire 17 (FIG. 1) interconnects rings 15, 16 and 18, and resistor R1 (not visible in FIG. 5). The outside diameter of ring 15 is equal to the inside diameter of ring 16, and the outside diameter or ring 16 is equal to the inside diameter of ring 18. Thus the biasing rings occupy respective radial zones relative to rod 11, with rings occupying radially outer zones being spaced further rearwardly from the front tip of probe 11. It will become apparent from the preceding disclosure that even more biasing rings of greater diameter and greater rearward placement could be added without departing from the invention.

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

What is claimed is:

1. A capacitive sensor comprising, in combination:
    (a) an electrically conductive rod having front and rear ends;
    (b) a first electrically conductive ring having an outside diameter and substantially encircling said rod at a first distance rearwardly from the front end thereof; and
    (c) a second electrically conductive ring electrically connected to said first ring, said second ring having an outside diameter greater than said first ring outside diameter and substantially encircling said rod at a second distance rearwardly from the front end thereof, said second distance exceeding said first distance said conductive rings being carried on and electrically insulated from said rod.

2. The sensor of claim 1 having insulating support means attached to said rod and an electrically conductive plate adjustably mounted on said support means for movement of said plate relative to said rod.

3. The sensor of claim 2 having a first terminal, a first resistance connected between both of said rings and said first terminal, a second resistance connected between said plate and said first terminal, and a capacity limit switch connected to said first terminal.

4. The sensor of claim 3 wherein said rear end of said rod is electrically connected to said capacity limit switch.

5. The sensor of claim 4 further comprising an amplifier controller electrically connected to said capacity limit switch for receiving a signal generated thereby.

6. The sensor of claim 5 wherein said amplifier controller has a relay actuatable by said capacity limit switch signal.

7. The sensor of claim 2 wherein said plate is substantially planar.

8. The sensor of claim 7 wherein said plate is substantially circular.

9. The sensor of claim 2 wherein the distance between said plate and said rod is manually adjustable.

10. The sensor of claim 7 wherein the major plane of said plate is disposed substantially parallel to the major axis of said rod.

11. The sensor of claim 2 wherein the distance between said plate and said rod is automatically adjustable.

12. The sensor of claim 1 wherein an electrically conductive probe rod tip is disposed at said front end of said rod forward of said first ring, said probe rod tip having a diameter no greater than the diameter of said rod.

13. A variable capacity proximity sensor for detecting the presence of an object at a predetermined position with respect to said sensor, said object being detectable irrespective of the size thereof, comprising:
    (a) support means being electrically conductive, generally longitudinal and having a lower end;
    (b) a first electrically conductive element having an outside dimension, said first element being supported by, but electrically insulated from, said support means and being disposed at a first distance from said lower end thereof;
    (c) a second electrically conductive element having an outside dimension greater than the outside dimension of said first element and being supported by, but electrically insulated from, said support means and being at a distance greater than said first distance from said lower end of said support means; and
    (d) means electrically connected to each of said first and second elements and to said support means for generating a signal indicative of the presence of an object at a predetermined distance from said lower end of said support means.

14. The sensor of claim 13 further comprising insulative mounting means supported by said support means and electrically conductive dielectric flux field detection means adjustably connected thereto, said detection means being electrically connected to said signal generating means.

15. The sensor of claim 14 further comprising a subsequent electrically conductive element having a greater outside diameter and being supported by said support means at a successively greater distance from said lower end thereof than said second element.

16. The sensor of claim 15 wherein said elements substantially completely surround said support means.

17. The sensor of claim 14 further comprising a series of subsequent electrically conductive elements having progressively greater outside diameters and being supported by said support means at successively greater distances from said lower end thereof than previous elements, whereby a series of ever greater elements at ever greater distances from said lower end of said support means is provided to detect the presence of respectively larger objects.

18. The sensor of claim 17 wherein said elements substantially completely surround said support means.

19. The sensor of claim 18 wherein said support means is cylindrically shaped and said elements are ring shaped.

20. The sensor of claim 13 wherein said elements substantially completely surround said support means.

* * * * *